(12) United States Patent
Naylor-Smith et al.

(10) Patent No.: US 7,105,838 B2
(45) Date of Patent: Sep. 12, 2006

(54) MULTI DIRECTIONAL MECHANICAL SCANNING IN AN ION IMPLANTER

(75) Inventors: Richard Naylor-Smith, West Sussex (GB); Simon Frederick Dillon, Surrey (GB); Richard Cooke, Worthing (GB)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 10/518,516

(22) PCT Filed: Jun. 20, 2003

(86) PCT No.: PCT/GB03/02691

§ 371 (c)(1),
(2), (4) Date: Dec. 20, 2004

(87) PCT Pub. No.: WO04/001789

PCT Pub. Date: Dec. 31, 2003

(65) Prior Publication Data
US 2005/0173655 A1    Aug. 11, 2005

(30) Foreign Application Priority Data
Jun. 21, 2002  (GB) ................... 0214384.0

(51) Int. Cl.
*H01J 37/20*  (2006.01)
*H01J 37/317*  (2006.01)
(52) U.S. Cl. ............... 250/492.21; 250/442.11
(58) Field of Classification Search .......... None
See application file for complete search history.

(56) References Cited

U.S. PATENT DOCUMENTS

| 5,003,183 | A |  | 3/1991 | Nogami et al. |
| 5,194,748 | A |  | 3/1993 | Aitken |
| 5,229,615 | A |  | 7/1993 | Brune et al. |
| 5,406,088 | A |  | 4/1995 | Brune et al. |
| 5,898,179 | A |  | 4/1999 | Smick et al. |
| 5,956,077 | A |  | 9/1999 | Qureshi et al. |
| 6,313,469 | B1 | * | 11/2001 | Tamai ................ 250/442.11 |
| 6,953,942 | B1 | * | 10/2005 | Graf et al. ............ 250/492.21 |
| 7,049,210 | B1 | * | 5/2006 | Murrell et al. ............ 438/535 |
| 2005/0247891 | A1 | * | 11/2005 | Asdigha et al. ........ 250/492.21 |

FOREIGN PATENT DOCUMENTS

| GB | 1490481 | 11/1977 |
| JP | 63080454 | 4/1988 |
| JP | 2199758 | 8/1990 |
| JP | 3029258 | 2/1991 |

* cited by examiner

*Primary Examiner*—Jack I. Berman
(74) *Attorney, Agent, or Firm*—Boult Wade Tennant

(57) ABSTRACT

An end station for an ion implanter has a vacuum chamber which receives an ion beam. A wafer holder is mounted at the distal end of a scanning arm which has its proximal end attached to the chamber wall. The scanning arm has at least two rotary joints providing articulation of the arm to permit movement of the wafer holder in two orthogonal scan directions in a scan plane transverse to the beam path through the vacuum chamber. A scanning arm driver moves the substrate holder in the scan plane in a desired two-dimensional scan pattern relative to the beam path.

11 Claims, 5 Drawing Sheets

MULTI DIRECTIONAL MECHANICAL SCANNING IN AN ION IMPLANTER

FIELD OF THE INVENTION

This invention relates to an ion implanter and an end station therefor incorporating apparatus for multi directional mechanical scanning of the semiconductor wafer or other substrate to be implanted. The invention is also concerned with a method for multi directional mechanical scanning of a substrate for implantation in an ion implanter.

BACKGROUND OF THE INVENTION

In a typical ion implanter, a relatively small cross-section beam of dopant ions is scanned relative to a silicon wafer or other substrate. This can be done in one of three ways: scanning of the beam in two directions relative to a stationary wafer, scanning of the wafer in two directions relative to a stationary beam, or a hybrid technique in which the beam is scanned in one direction while the wafer is mechanically scanned in a second, typically orthogonal direction.

Batch implanters, designed for the simultaneous implantation of a batch of wafers in the end station of an implanter, typically have a rotating wheel carrying a number of wafers around its periphery. The wheel is rotated so that each wafer passes through the ion beam in turn and then the axis of rotation of the wheel is reciprocated to translate the circumferential path of the wafers on the wheel substantially radially across the beam to ensure all parts of the wafer are evenly implanted. An example of such a scanning wheel type batch implanter is disclosed in U.S. Pat. No. 5,389,793.

A system for scanning the ion beam in two directions relative to a stationary wafer is disclosed in U.S. Pat. No. 4,736,107 and hybrid techniques with the beam scanned in one direction and the wafer mechanically scanned in an orthogonal direction are disclosed in U.S. Pat. No. 5,898,179, U.S. Pat. No. 5,003,183, U.S. Pat. No. 5,229,615 and U.S. Pat. No. 5,406,088.

Two dimensional beam scanning systems and hybrid scanning systems are normally favoured for implanting single wafers one at a time. However, arrangements involving scanning the ion beam present certain challenges to the design of successful implanters. Scanning the ion beam with varying magnetic fields is favoured over electrostatic beam scanning, because the presence of electric fields removes neutralising electrons from the beam plasma, causing space charge resulting in beam control problems. This is especially severe at low energies and high beam currents. However, beam scanning systems, especially magnetic scanning systems, are bulky and relatively expensive, and require an extended beam line, which can substantially increase the overall footprint of the ion implanter in the semiconductor fabrication facility.

SUMMARY OF THE INVENTION

The present invention seeks to avoid the problems with beam scanning arrangements in single wafer implanters by providing an end station for an implanter with a mechanism for two-dimensional scanning of the wafer across a substantially stationary ion beam.

Accordingly, the invention provides an end station for an ion implanter comprising a vacuum chamber arranged to receive an ion beam extending along a predetermined beam path in said chamber and having a chamber wall, a wafer holder for holding a wafer in a wafer plane, a scanning arm having a distal end supporting the wafer holder within the vacuum chamber and a proximal end attached to the chamber wall, said scanning arm having at least first and second rotary joints providing articulation of the arm to permit movement of said substrate holder in two orthogonal scan directions in a scan plane transverse to said beam path, and a scanning arm driver operative to move said substrate holder in said scan plane in a desired two-dimensional scan pattern relative to said beam path.

This construction enables a required two-dimensional scanning pattern to be applied mechanically to a wafer holder, using only rotary joints, including the two rotary joints provided in the scanning arm.

Preferably a third rotary joint is provided mounting said substrate holder at said distal end of the scanning arm and having an axis of rotation normal to said wafer plane. Then this third rotary joint can be operated during scanning to maintain the orientation of a wafer on the wafer holder constant relative to said axis of rotation normal to the wafer plane, during the scanning of the wafer holder.

Preferably further, a fourth rotary joint is provided mounting said proximal end of said scanning arm to said chamber wall. The fourth rotary joint may have an axis of rotation parallel to said scan plane, whereby rotation of the scanning arm at said fourth rotary joint rotates said scan plane relative to the beam path. This allows the angle of implant to be adjusted. Preferably the axis of the fourth rotary joint lies in the wafer plane and, preferably, also intercepts the beam path through the vacuum chamber. Then adjustment of the implant angle is conducted without altering the distance along the beam path of the centre of the scan plane.

The invention also provides a method of moving a workpiece in a desired two-dimensional scan pattern, comprising mounting the workpiece on a workpiece holder at the distal end of a scanning arm with at least two rotary joints providing articulation of the arm to permit movement of said holder in two orthogonal scan directions in a scan plane, and driving the scanning arm to move said holder in said scan plane in said desired two-dimensional scan pattern.

BRIEF DESCRIPTION OF THE DRAWINGS

An example of the invention will now be described with reference to the following drawings.

DETAILED DESCRIPTION OF THE PREFERRED EMBODIMENTS

Figure 1:
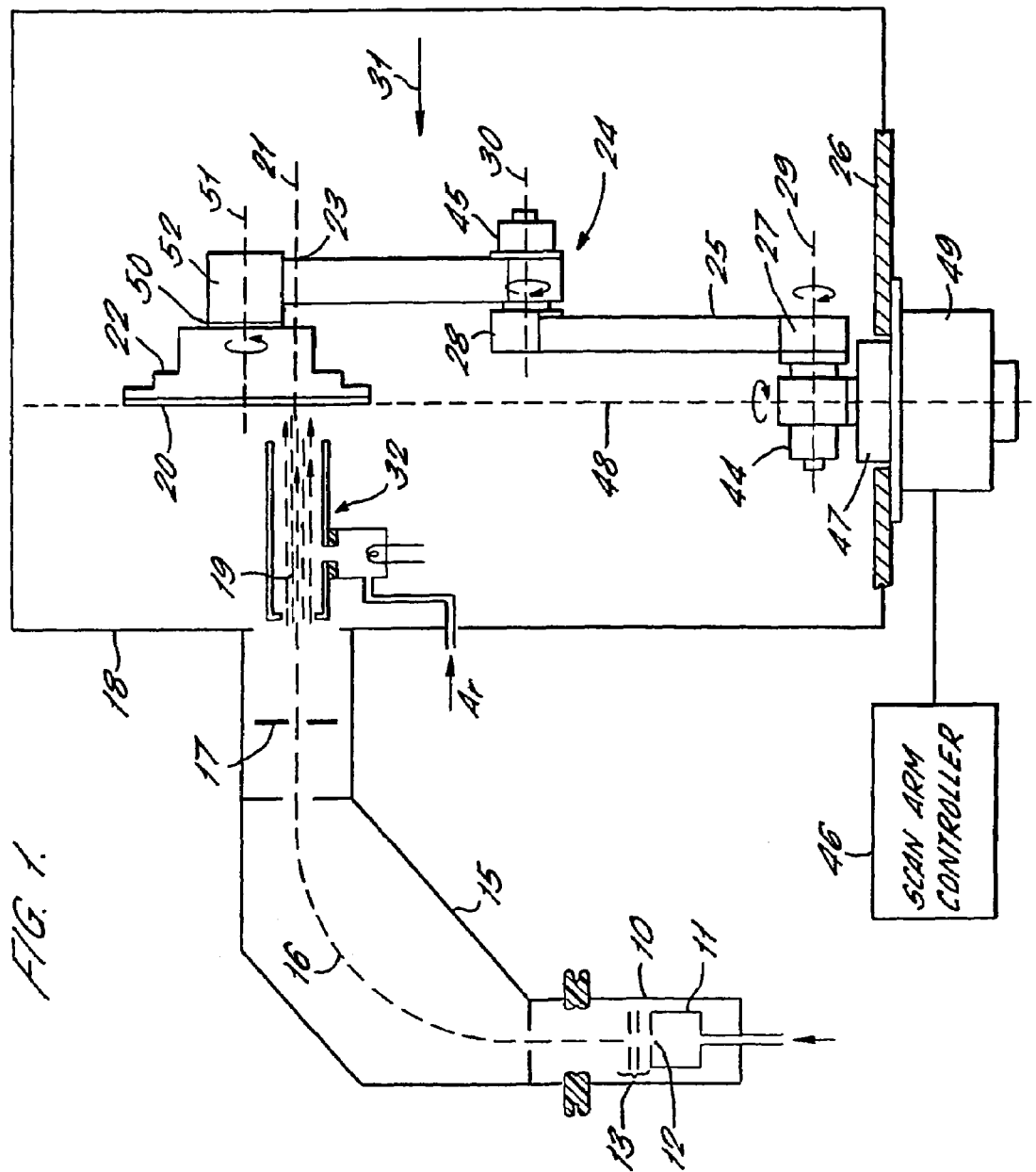
FIG. 1 is a schematic diagram partly in cross-section of an ion implanter incorporating an end station embodying the present invention.

FIG. 1 provides a schematic illustration of an ion implanter. An ion source 10 includes a plasma chamber 11 in which ions of a species to be implanted are formed. The ions are extracted through a slit 12 in a front face of the plasma chamber 11, by means of an electric field controlled by extraction electrodes 13, to form an ion beam 14. The ion beam 14 enters a mass analyser 15 in which a magnetic field directed normal to the plane of the paper of the figure causes the ions to move in a curved path 16, with a radius of curvature dependent on the momentum and charge state of the ions entering the analyser. Because the ions entering the mass analyser will have the same energy, defined by the potential difference between the plasma chamber 11 and the structure of the mass analyser 15, the radius of curvature of the ions in the mass analyser is in practice dependent on the mass-to-charge ratio of the ions.

As a result, the trajectories of ions of different mass-to-charge ratios are dispersed in the plane of the paper of the figure as they leave the mass analyser 15, and a mass resolving slit 17 is arranged to permit only ions of a selected mass-to-charge ratio to pass onwards and enter an end chamber 18 of the ion implanter. The detailed operation and structure of the ion implanter as described so far will be understood by those skilled in this art, and further information may be obtained from for example U.S. Pat. No. 5,389,793 or U.S. Pat. No. 5,969,366.

In the end chamber 18, an ion beam 19 of ions of selected mass-to-charge ratio (usually singly charged ions of a particular mass) are directed at a semiconductor wafer 20 to implant the ions in the wafer as prescribed by a predetermined semiconductor manufacturing process. In front of the wafer, the ion beam 19 passes through an electron flood system 32 of known type (see U.S. Pat. No. 5,399,871) to provide electrons for neutralising any positive charge build-up on the wafer surface during implanting.

The ion beam 19 may have a diameter, where it impinges, upon the wafer 20 of between 10 and 40 mm, whereas the wafer 20 typically has a diameter of 200 mm, or more recently 300 mm. It is very important in ion implantation procedures to ensure that the dose of ions delivered to each unit area of the semiconductor wafer 20 is uniform over the full surface area of the wafer 20. Accordingly, since in the present embodiment, the ion beam 19 in the end chamber 18 is not scanned, but has a substantially constant beam axis 21, it is important to ensure that the semiconductor wafer 20 is mechanically translated so that the beam 19 describes a predetermined scan pattern on the wafer 20 to ensure uniform distribution of the dose over the wafer surface.

The mechanism for holding the semiconductor wafer 20 in the end chamber 18 and for scanning the wafer as required across the ion beam 19 will now be described in greater detail. This mechanism is illustrated in a plan view in FIG. 1, and is further illustrated in a perspective view in FIG. 2.

As will be appreciated, the end chamber 18 of the ion implanter constitutes a vacuum chamber which receives the ion beam 19 extending along the predetermined beam axis 21. The semiconductor wafer 20 is held on a wafer holder 22, itself mounted at the outer or distal end 23 of a scanning arm 24. The near or proximal end 25 of the scanning arm is mounted on a wall 26 of the end chamber 18.

The scanning arm 24 is articulated by a first rotary joint 27 at the proximal end of the scanning arm, and a second rotary joint 28 approximately midway along the length of the scanning arm 24. The axes of rotation 29 and 30 of the joints 27 and 28 are parallel to each other and also parallel to a plane containing the beam axis 21 extending normal to the paper in FIG. 1, i.e. a vertical plane in the orientation illustrated in FIG. 2.

Figure 2:
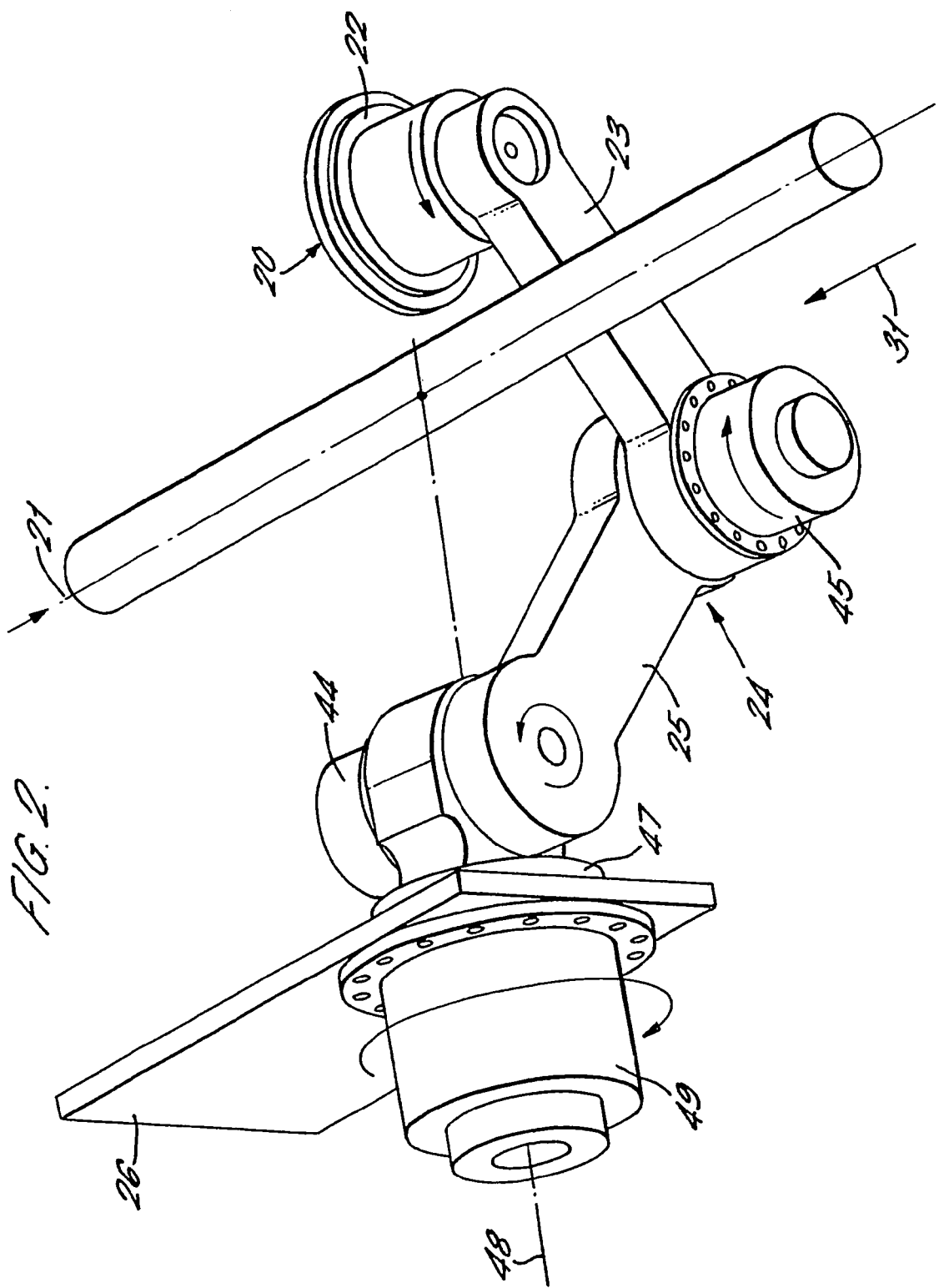
FIG. 2 is a perspective view of the mechanical wafer scanning system in the end station of the implanter of FIG. 1.
Figure 3:
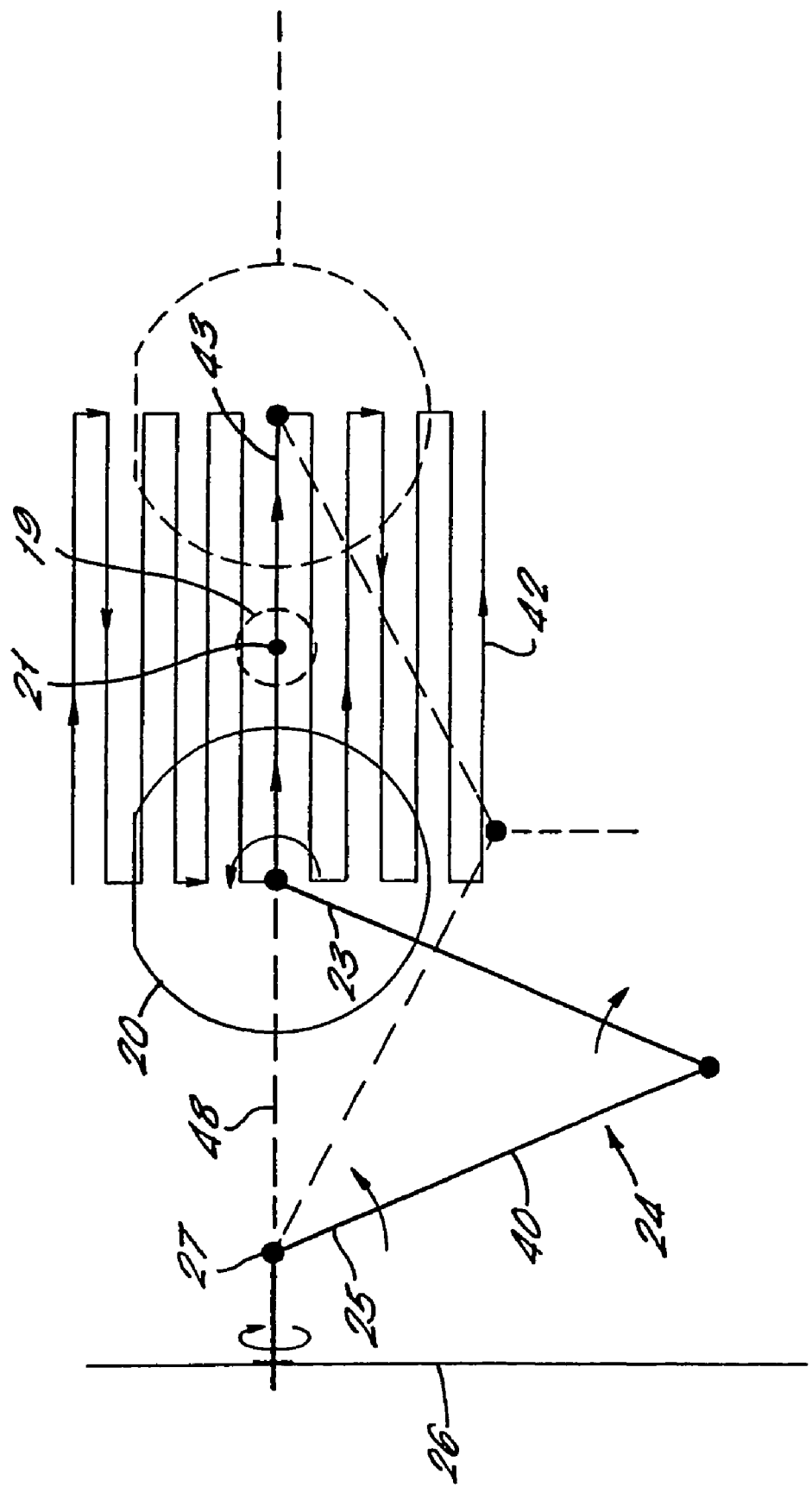
FIG. 3 is a schematic representation of the operation of the mechanical scanning system of FIGS. 1 and 2, illustrating the production of a raster scan pattern.

The operation of the scanning arm 24 to provide a desired two-dimensional scanning pattern of the wafer 20 through the beam axis 21, is best illustrated in the schematic diagram of FIG. 3. In this figure, components common to those of FIGS. 1 and 2 are given the same reference numerals. The diagram of FIG. 3 is taken looking directly along the beam axis 21, i.e. in the direction of arrow 31 in FIGS. 1 and 2. Accordingly, the articulated scanning arm 24 comprises an inner part 40 and an outer part 41 which are articulated together by the rotary joint 28. The inner part 40 is itself connected to the wall 26 by rotary joint 27.

A parallel linear raster scan pattern for the wafer 20 is represented by the line 42, which is the locus of the centre point of a wafer 20 held on the wafer holder 22 as it is scanned through the ion beam 19 by appropriate operation of the rotary joints 27 and 28. In FIG. 3, a single traverse of the scan pattern, from left to right in FIG. 3, along a central scan line 43, is particularly illustrated by the solid and dotted line representations of the scan arm parts 40,41 and the wafer 20.

Each of rotary joints 27 and 28 is driven by a respective electric motor 44 and 45, best seen in FIGS. 1 and 2.

The scan arm 24 is constructed of hollow elongate members, providing the arm parts 40 and 41, and the rotary joints 27 and 28 are vacuum sealed joints, enabling the interior of the scanning arm to be at atmospheric pressure, whilst the arm operates in the vacuum environment within the end chamber 18. Rotary vacuum seals are well established in vacuum technology, and the seals used for joints 27 and 28 may be ferrofluidic vacuum seals for example, but any other kind of rotary vacuum seal may be used. The rotary joints 27 and 28 are designed to permit connection through the joint of various facilities, including electrical conductors, e.g. for supplying electric motors, and, if necessary, cooling fluid lines. In many applications, the wafer 20 on the holder 22 must be cooled during implanting, and cooling fluid supply lines are provided extending along the scan arm 24 and through the rotating joints 27 and 28.

In order to perform the raster scan 42 illustrated in FIG. 3, motors 44 and 45 are controlled by drive voltages provided by scan arm controller 46 (FIG. 1). The scan arm controller 46 simultaneously controls the speed of rotation of motors 44 and 45, in accordance with a predetermined control algorithm, so that the wafer 20 is moved in accordance with the designed scan pattern across the ion beam. For example, a simultaneous anticlockwise motion of the scan arm part 40 around the rotary joint 27, and a clockwise motion of the scan arm part 41 relative to part 40 around the rotary joint 28, is required to produce the linear scan motion of the semiconductor wafer 20 along the scan line 43, illustrated in FIG. 3. The scan arm controller controls the speed of the motors 44 and 45 in accordance with the predetermined algorithm to provide a constant scan speed of the wafer along the line 43. The scan arm controller together with the motors 44 and 45 together constitute a scan arm driver which can control the position of the wafer within the end chamber 18 and produce any desired two-dimensional scan pattern.

In the arrangement shown in FIG. 3, the axes 27 and 28 of the scan arm 24 are normal to the plane of the paper, so that the two-dimensional scan pattern produced by this articulated scan arm is in a scan plane parallel to the plane of the paper.

In a preferred arrangement, the scan arm 24 is mounted to the wall 26 of the end chamber, by a further rotary joint 47, having an axis of rotation 48 which is parallel to the scan plane defined by the articulation of the scan arm 24. The entire scan arm mechanism 24 can be rotated about the axis 48 by means of a motor 49. Rotation of the scan arm 24 about the axis 48 produces a corresponding rotation of the scan plane relative to the ion beam axis 21. In this way, the scan plane can be angled to enable a desired angle of implantation into a semiconductor wafer on the wafer holder 22.

Importantly, in the example described, the axis 48 of rotation of the scan arm lies in the plane occupied by a wafer 20 on the wafer holder 22, and also intercepts the beam axis 21, as best shown in FIGS. 2 and 3. This geometry ensures that the implant angle of the wafer 20 can be adjusted by rotation of the scan arm 24 about the axis 48, without producing any movement of the centre of the scan pattern along the beam axis 21, and has been referred to as isocentric implant angle adjustment.

The wafer holder 22 may further be rotatably mounted by means of a rotary joint 50 at the distal end of the scanning arm 24, so as to be rotatable about an axis of rotation 51. The axis 51 is arranged to be parallel to the axes 29 and 30. Rotation of the wafer holder 22 about the axis 51 is controlled by a further motor 52, which is also controlled from the scan arm controller 46. In a preferred arrangement, the scan arm controller 46 causes the motor 52 to rotate the wafer holder 22 anticlockwise as the wafer holder is translated along the scan line 43 (FIG. 3), so as to maintain the orientation of the wafer 20 (and the wafer holder 22) constant about the axis 51. The motor 52 produces corresponding rotation during other elements of the scan pattern 42 so that the wafer orientation is maintained constant throughout.

The motor 52 is controlled by the scan arm controller 46 in accordance with a predetermined algorithm, in the same way as the control of motors 44 and 45. The algorithm for control of the various motors of the scan arm 24 may be stored in memory within the scan arm controller 46. Devising an appropriate algorithm would not present a problem to a skilled person. For example the relationships between the rotary positions of the various motors 44, 45 and 52 and desired positions of the wafer holder are defined by trigonometric equations which can easily be deduced by the skilled person.

The raster scan pattern illustrated in FIG. 3 provides relatively long reciprocating linear motions parallel to the axis of rotation 48, interconnected by short transverse motions, to produce a series of parallel scan lines relative to the beam axis 21. Alternative scan orientations and patterns can be used. For example in FIG. 4, the scan pattern of FIG. 3 has been rotated by approximately 45° relative to the axis 48. An appropriate algorithm can readily be devised and stored in the scan arm controller 46 to perform the scan pattern illustrated in FIG. 4. An advantage of the scan pattern of FIG. 4 may be that the long reciprocating movements of the wafer represented by the parallel scan lines 60, is accommodated by a relatively larger rotational movement of the distal scan arm part 41, and a relatively smaller angular movement of the proximal scan arm part 40. This may provide a reduced loading on the motors 44 and 45 during performance of the scan pattern. It will be appreciated that the scanning should be performed at relatively high speed in order to achieve appropriate dose uniformity, or a required low overall dose from a relatively high beam current, and in any case to maximise productivity.

Figure 4:
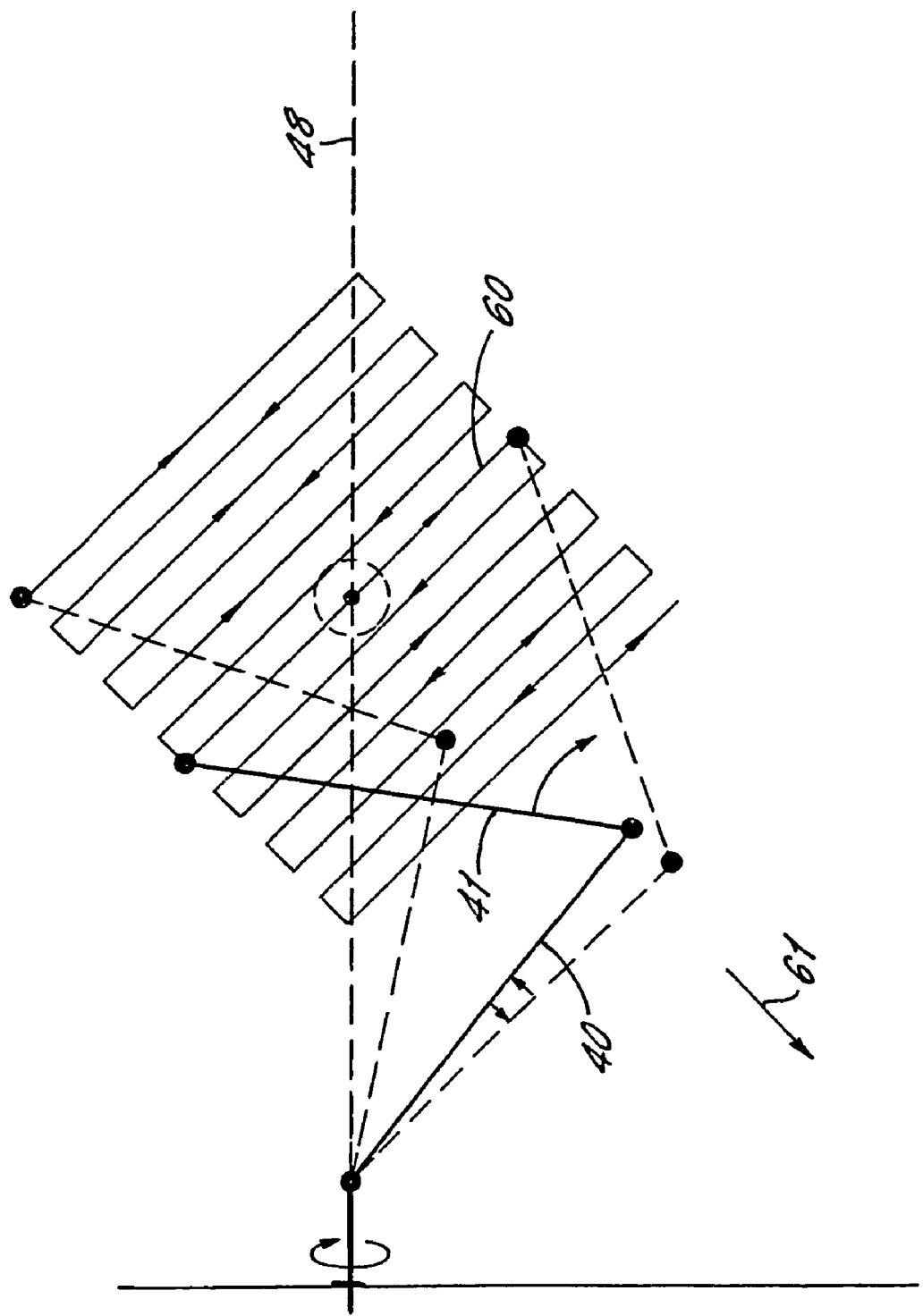
FIG. 4 is a schematic representation of a different operation of the scanning system.

Although the scan pattern of FIG. 4 is illustrated with the rapid scan lines 60 extending diagonally between top left and bottom right in the figure, it should be appreciated that the scan arm may be mounted in the end chamber so that gravity acts on the scan arm substantially perpendicularly to the scan line 60 in the direction of the arrow 61. Then the main reciprocating motion of the wafer holder along the scan line 60 can be horizontal, again minimising loading on the drive motors 44 and 45 of the scan arm.

Figure 5:
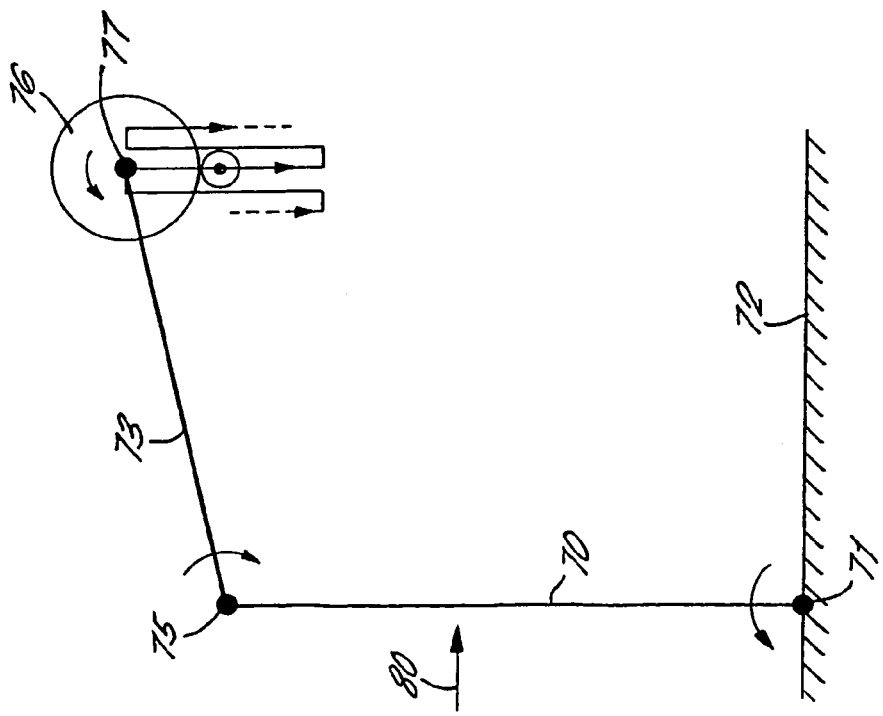
FIG. 5 is a schematic representation of a further embodiment of the invention.

FIG. 5 illustrates a further arrangement by way of example. In FIG. 5, a proximal scan arm part 70 is mounted for rotation about a rotary joint 71 relative to a chamber floor part 72, so as to be substantially vertical in the end chamber of the implanter. A distal scan arm part 73 extends generally horizontally, and the ion beam axis 74 is substantially at the level of rotary joint 75 between qthe proximal and distal arm parts 70 and 73. Wafer holder 76 is rotatably mounted by a rotary joint 77 at the distal end of the arm part 73. The wafer holder 76 can be scanned across the beam axis 74 in a desired scan pattern by appropriate simultaneous control of respective motors driving the rotary joints 71, 75 and 76.

Figure 6:
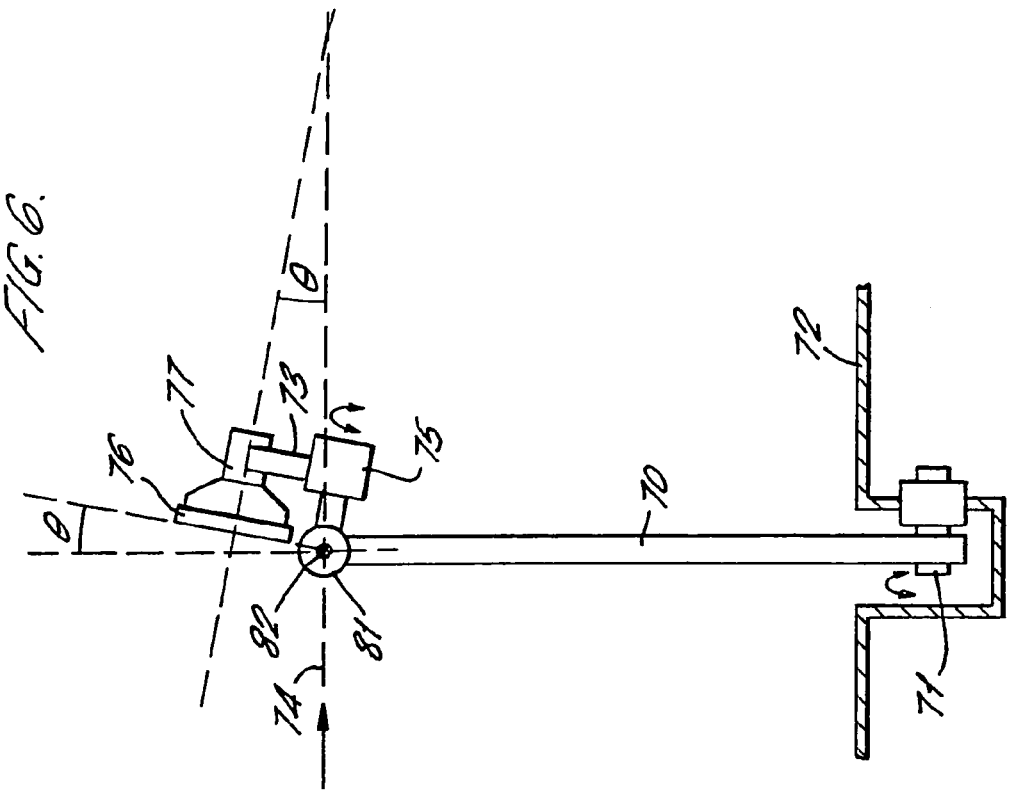
FIG. 6 is a view, partly in cross-section of a modification of the embodiment of FIG. 5.

In this arrangement the axes of joints 71, 75 and 76 are preferably parallel to the beam axis, and the wafer holder 76 holds a wafer to be implanted so as to be normal to the axis of joint 77 and to the beam axis 74. FIG. 6 illustrates a modification which can allow the implant angle to be adjusted.

In FIG. 6, the scan arm of FIG. 5 is viewed along the direction of arrow 80 in FIG. 5, and corresponding parts are given the same reference numbers. However, the rotary joint 75 is mounted to the distal end of the proximal scan arm part 70 by a further rotary joint 81 having an axis 82 of rotation perpendicular to the beam axis 74 and to the axis of the joint 75, so that the distal scan arm part 73 together with the wafer holder 76 can be pivoted about the axis 82 so that the normal to a wafer on the holder 76 presents a selected angle $\theta$ to the ion beam axis 74. Preferably, as illustrated, the axis 82 of the joint 81 is in the plane of a wafer on the holder 76, so that scanning of the wafer at the angle $\theta$ is nearly isocentric.

The arrangement of FIGS. 5 and 6 may be particularly convenient because it can employ the basic mechanical structure of a batch end station, for example as shown in U.S. Pat. No. 5,641,969, with the scan wheel replaced by the distal scan arm part 73.

Although FIGS. 3, 4, 5 and 6 illustrate linear parallel raster scan patterns, it should be appreciated that suitable algorithms can be stored in the scan arm controller 46 to perform any desired two-dimensional scan pattern, with the range of movement of the scan arm 24. For example, circular and spiral scan patterns can be accommodated with appropriate control algorithms.

In the examples of the invention described and illustrated in the figures, the scan arm driver includes respective electric motors mounted coaxially on each rotary joint. Instead, one or more of the electric motors could be mounted away from the axis of the respective rotary joint and coupled to drive the joint by means of gear linkages or drive belts and pulleys. Also, one or more of the electric motors of the driver could be accommodated at or near the main hub connecting the scan arm to the end chamber wall, with drive belts and linkages extending along the parts 40 and 41 of the scan arm to provide drive to the respective joints 28 and 50.

The electric motors included in the scan arm driver in the described examples are precision motors, typically servo motors, with position feedback to the scan arm controller. The scan arm controller may operate using a stored table of sequential motor positions, which together correspond to the desired sequential positions of the wafer holder 22, during the complete scan pattern. Alternatively, mathematical algorithms may be provided in the scan arm controller containing equations converting data describing the positions and movement of the wafer holder 22, during the course of a scan pattern, into corresponding positions and movement of the motors of the scan arm driver required to achieve the prescribed scan pattern.

In the example of the invention described with reference to the drawings, the two parts 40 and 41 of the scan arm 24 are of similar length. It will be understood by the skilled person that one part may be substantially shorter than the other part, so long as the two arm parts between them the required range of displacement of the wafer holder 22 throughout the scan plane.

In general, other arrangements different from those specifically described above will be apparent to those skilled in this art.

The invention claimed is:

1. An end station for an ion implanter, comprising
   a vacuum chamber arranged to receive an ion beam extending along a predetermined beam path in said chamber and having a chamber wall,
   a wafer holder for holding a wafer in a wafer plane,
   a scanning arm having a distal end supporting the wafer holder within the vacuum chamber and a proximal end attached to the chamber wall,
   said scanning arm having at least first and second rotary joints providing articulation of the arm to permit movement of said substrate holder in two orthogonal scan directions in a scan plane transverse to said beam path,
   and a scanning arm driver operative to move said substrate holder in said scan plane in a desired two dimensional scan pattern relative to said beam path.

2. An end station as claimed in claim 1, including a third rotary joint mounting said substrate holder at said distal end of the scanning arm and having an axis of rotation normal to said wafer plane.

3. An end station as claimed in claim 1, including a fourth rotary joint mounting said proximal end of said scanning arm to said chamber wall and having an axis of rotation parallel to said scan plane, whereby rotation of the scanning arm at said fourth rotary joint rotates said scan plane relative to said beam path.

4. An end station as claimed in claim 1 wherein said first and second rotary joints have axes perpendicular to said wafer plane, whereby said scan plane is parallel to said wafer plane.

5. An end station as claimed in claim 3, wherein said first and second rotary joints have axes perpendicular to said wafer plane, and the axis of said fourth rotary joint lies in said wafer plane.

6. An end station as claimed in claim 5, wherein the axis of said fourth rotary joint intercepts said beam path.

7. An end station as claimed in claim 5, wherein the axis of said fourth rotary joint is perpendicular to said beam path.

8. An end station as claimed in claim 2, wherein said first and second rotary joints have axes perpendicular to said wafer plane, and said scanning arm driver is operative to drive said third rotary joint so as to maintain the orientation of the wafer holder constant during said desired scan pattern.

9. An end station as claimed in claim 1, wherein said scan arm driver is operative to provide a linear orthogonal raster scan pattern of the substrate holder relative to the beam path, comprising parallel linear scans of the wafer holder across the beam path separated by a predetermined scan pitch.

10. An end station as claimed in claim 1, wherein said scanning arm driver comprises respective first and second motors driving said first and second rotary joints, and a motor controller controlling said first and second motors to provide said desired scan pattern.

11. A method of moving a workpiece in a desired two-dimensional scan pattern, comprising
    mounting the workpiece on a workpiece holder at the distal end of a scanning arm with at least two rotary joints providing articulation of the arm to permit movement of said holder in two orthogonal scan directions in a scan plane,
    and driving the scanning arm to move said holder in said scan plane in said desired two dimensional scan pattern.

* * * * *